(12) United States Patent
Freitag et al.

(10) Patent No.: US 6,791,871 B2
(45) Date of Patent: Sep. 14, 2004

(54) MRAM CONFIGURATION

(75) Inventors: Martin Freitag, München (DE); Thomas Roehr, Yokohama (JP)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/627,904

(22) Filed: Jul. 25, 2003

(65) Prior Publication Data
US 2004/0017706 A1 Jan. 29, 2004

Related U.S. Application Data

(63) Continuation of application No. PCT/DE02/00207, filed on Jan. 23, 2002.

(30) Foreign Application Priority Data

Jan. 25, 2001 (DE) .......................................... 101 03 313

(51) Int. Cl.[7] .............................................. G11C 11/00
(52) U.S. Cl. ........................ 365/158; 365/171; 365/173
(58) Field of Search ................................. 365/158, 171, 365/173, 157

(56) References Cited

U.S. PATENT DOCUMENTS

| | | | |
|---|---|---|---|
| 5,734,605 A | 3/1998 | Zhu et al. | |
| 5,894,447 A | 4/1999 | Takashima | |
| 5,940,319 A | 8/1999 | Durlam et al. | |
| 6,153,443 A | 11/2000 | Durlam et al. | |
| 6,165,803 A | 12/2000 | Chen et al. | |
| 6,226,197 B1 * | 5/2001 | Nishimura | 365/171 |
| 6,331,943 B1 * | 12/2001 | Naji et al. | 365/158 |
| 6,512,690 B1 * | 1/2003 | Qi et al. | 365/171 |

* cited by examiner

Primary Examiner—Gene N. Auduong
(74) Attorney, Agent, or Firm—Laurence A. Greenberg; Werner H. Stemer; Gregory L. Mayback

(57) ABSTRACT

An MRAM configuration has selection transistors and MTJ layer sequences lying in parallel with each other in a memory cell matrix. A considerable space saving can thus be achieved and therefore the MRAM configuration is less expensive to manufacture and has a greater packing density. In addition, the MRAM configuration allows a rapid read access with a minimal area requirement.

6 Claims, 3 Drawing Sheets

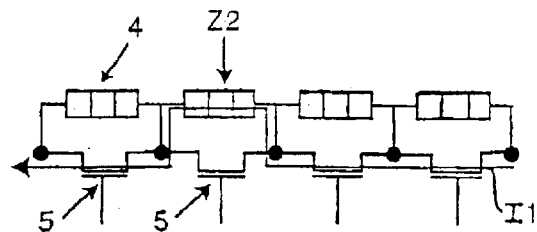
Fig. 1
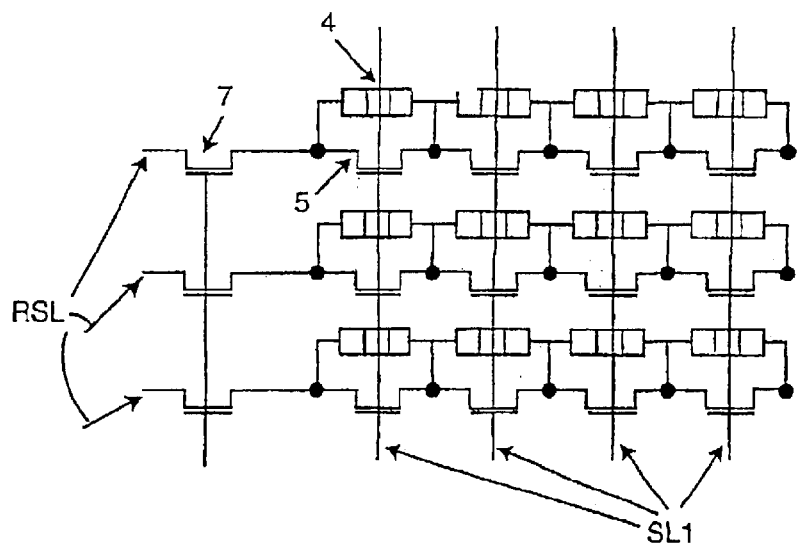
Fig. 2
Fig. 3
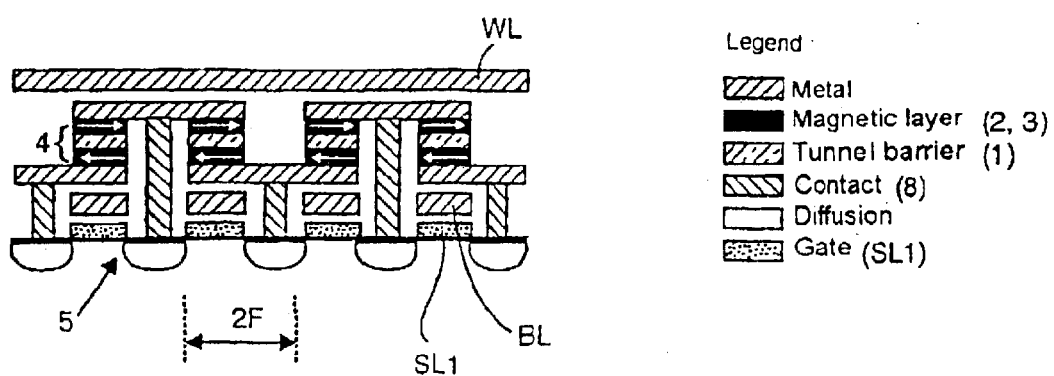

MRAM CONFIGURATION

CROSS-REFERENCE TO RELATED APPLICATION

This application is a continuation of copending International Application No. PCT/DE02/00207, filed Jan. 23, 2002, which designated the United States and was not published in English.

BACKGROUND OF THE INVENTION

Field of the Invention

The present invention relates to an MRAM configuration (MRAM=magnetoresistive RAM) containing a multiplicity of memory cells which are disposed in a memory matrix and each of which contains at least one magnetic tunnel junction (MTJ) layer sequence and a selection transistor. The MTJ layer sequences are in each case located between word lines and bit lines, which run at a distance from one another. The selection transistors are connected to first select lines at their gates for reading from the memory cells and the MTJ layer sequences are connected to second select lines.

In their simplest embodiment, MRAM configurations—also called MRAMs for short hereinafter—contain memory cells which are disposed in a memory matrix and each of which has only the MTJ layer sequence in each case. Such an MTJ layer contains the tunnel barrier layer lying between the soft-magnetic layer and the hard magnetic layer and contains an oxide barrier. What is advantageous about the configuration is its high-density configuration: in a completely ideal manner, only an area of 4 $F^2$ is required per information content or bit, where F denotes the minimum feature size of the technology used. However, what may be regarded as a major disadvantage of such a configuration of an MRAM configuration is that considerable parasitic currents flow through adjacent cells during read-out on account of the only slight differences in the resistance value (about 15%; see above), with the result that such an MRAM configuration can only be read from very slowly overall.

In order to avoid this disadvantage of the slow—and ultimately also unreliable on account of the parasitic currents—read-out of the MRAM configuration a new configuration has already been proposed, in which each individual memory cell contains an MTJ layer sequence and a selection transistor. What is disadvantageous about this MRAM configuration, however, is that the advantage of a high-density configuration is lost, since it is only possible to achieve an effective cell area of 8 $F^2$.

In order to resolve the above conflict between area requirement ("$F^2$") on the one hand, and fast read access without parasitic effects, on the other hand, thought has already been given, in the case of completely different memory configurations, namely DRAM configurations (DRAM=dynamic RAM), to use so-called "shared contacts", in which one contact of a selection transistor is used by a plurality of memory cells, preferably by two memory cells, and area ("$F^2$") is thus saved. However, this solution cannot be employed for MRAMs, and so the above problem area has also not been solved hitherto.

SUMMARY OF THE INVENTION

It is accordingly an object of the invention to provide an MRAM configuration that overcomes the above-mentioned disadvantages of the prior art devices of this general type, which allows a rapid read access with a minimal area requirement.

With the foregoing and other objects in view there is provided, in accordance with the invention, an MRAM configuration. The MRAM configuration includes word lines, bit lines running at a distance from the word lines, first select lines, second select lines, and a multiplicity of memory cells disposed in a memory matrix form. The memory cells contain MTJ layer sequences and selection transistors having gates and drain-source paths. The MTJ layer sequences in each case are disposed between the word lines and the bit lines. The selection transistors are connected to the select lines at the gates for reading from the memory cells. The MTJ layer sequences are connected to the second select lines. In a respective one of the memory cells a respective MTJ layer sequence and a respective drain-source path of a respective one of the selection transistors in each case lie parallel to one another, so that the second select lines being formed by the drain-source paths of the selection transistors lie in series with one another.

In the case of an MRAM configuration of the type mentioned in the introduction, the object is achieved according to the invention by virtue of the fact that in the memory cells the MTJ layer sequence and the drain-source path of a selection transistor in each case lie parallel to one another, so that the second select lines are formed by the source-drain paths of the selection transistors lying in series with one another.

Thus, in the case of the MRAM configuration according to the invention, the selection transistors and the MTJ layer sequences of the individual memory cells lie parallel to one another. The memory cells or "basic elements" are then joined together to form chains, chains that run parallel to one another forming a memory matrix. The selection of a chain in such a memory matrix can be effected by a separate selection transistor. In other words, each individual chain is assigned a separate selection transistor at one end of the chain.

The MRAM configuration according to the invention is written to in a customary manner by applying a corresponding signal in each case to the desired word and bit lines. During read-out, first a chain of the memory matrix is defined by the separate selection transistors. All the transistors of the chain are then activated apart from the transistor of the memory cell whose cell content is to be read. The transistor of the memory cell to be read thus remains turned off. If a current is then sent through the chain of the transistor to be read, the current flows solely through the MTJ layer sequence of the memory cell to be read and through all the selection transistors of the remaining memory cells of the chain. The cell content of the memory cell to be read can thus be determined.

The MRAM configuration according to the invention is distinguished by a low area requirement. In the chain, given a corresponding configuration, a memory cell containing the MTJ layer sequence and a selection transistor lying parallel thereto has an effective cell area of 4 $F^2$. The separate selection transistor of a chain must be counted with this, which in turn requires an area of 4 $F^2$. For a chain having N memory cells, this results in an effective cell area for each memory cell of 4 $F^2$ (N+1)/N.

It should be noted that in the case of N=1, that is to say a chain containing just one memory cell, an effective cell area of 8 $F^2$ is present, which corresponds exactly to the previously known solution containing a series circuit of a selection transistor with an MTJ layer sequence. Therefore, the invention can be used particularly advantageously when, in an MRAM configuration, the condition N>1 is present, which applies, of course, to all the memory cells disposed in memory matrices.

The present invention, in a completely novel manner, departs from the previously customary principle of a series circuit containing an MTJ layer configuration and a selection transistor and proposes a novel concept in which the MTJ layer sequence and the selection transistor in each memory cell lie parallel to one another and are joined together to form chains.

In accordance with an added feature of the invention, selection transistors are provided and each of the second select lines of a chain of the memory cells in the memory matrix lies in series with a separate one of the selection transistors.

In accordance with an additional feature of the invention, the gates of the selection transistors are connected to the first select lines.

In accordance with another feature of the invention, the memory cells have a minimum dimension being 4 $F^2$ where F denotes a minimum feature size of a technology used.

In accordance with a further feature of the invention, the first select lines are routed above the gates of the selection transistors.

In accordance with a concomitant feature of the invention, the first select lines and the bit lines run parallel to one another.

Other features which are considered as characteristic for the invention are set forth in the appended claims.

Although the invention is illustrated and described herein as embodied in an MRAM configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic diagram of a chain of an MRAM configuration according to the invention;

FIG. 2 is a circuit diagram of a memory matrix of an MRAM configuration according to the invention;

FIG. 3 is a diagrammatic, sectional view of an exemplary embodiment of the MRAM configuration according to the invention;

DESCRIPTION OF THE PREFERRED EMBODIMENTS

Figure 5:
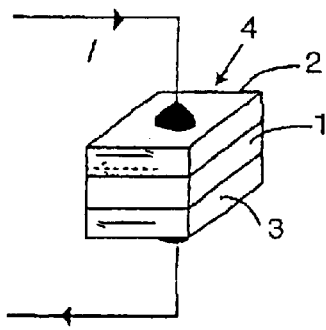
FIG. 5 is a perspective view of an MTJ layer sequence.

In all the figures of the drawing, sub-features and integral parts that correspond to one another bear the same reference symbol in each case. Referring now to the figures of the drawing in detail and first, particularly, to FIG. 5 thereof, there is shown in its simplest embodiment, an MRAM configuration—also called MRAM for short hereinafter. The MRAM contains a memory cell that is disposed in a memory matrix and each of which has only a MTJ layer sequence in each case. A tunnel barrier layer 1 lies between a soft-magnetic layer 2 and a hard magnetic layer 3 and contains an oxide barrier. The tunnel barrier layer 1, the soft-magnetic layer 2 and the hard-magnetic layer 3 thus form an MTJ layer sequence 4, the electrical resistance of which depends on the orientation of magnetic moments in the two magnetic layers and 2 and 3. This is because if the magnetizations in the two layers 2 and 3 are oriented parallel to one another, then the resistance of the MTJ layer sequence 4 is low, whereas an antiparallel orientation of the magnetizations produces a higher resistance of the MTJ layer sequence 4. The determination of a cell content of the memory cell formed from such an MTJ layer sequence 4 is measured by sending a current I through the MTJ layer sequence 4. The magnitude of the current I can then be used to deduce whether the MTJ layer sequence 4 is in the state of a high resistance (antiparallel orientation of the magnetizations) or in the state of a low resistance (parallel orientation of the magnetizations). Each of these states can then be assigned an information content "0" or "1".

Figure 6:
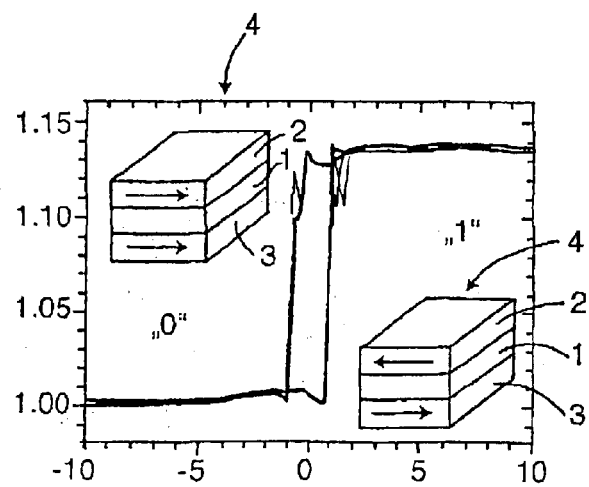
FIG. 6 is a graph elucidating a memory state in the MTJ layer sequence in accordance with FIG. 5.

This is illustrated diagrammatically in FIG. 6, in which the magnetic field generated by corresponding currents in the bit lines and word lines is plotted on the abscissa and the normalized resistance value is plotted on the ordinate. It can clearly be seen that the resistance of the MTJ layer sequence 4 is about 15% lower in the case of parallel orientation of the magnetizations than in the case of antiparallel orientation. The parallel orientation of the magnetization is assigned the information content "0" here, while the antiparallel orientation of the magnetization has the information content "1". However, other assignments are also possible, of course.

Figure 7:
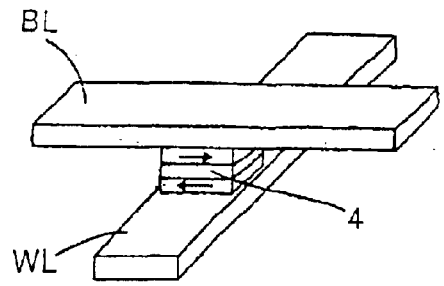
FIG. 7 is a perspective view of the MTJ layer sequence with a word line and a bit line.

Memory cells containing MTJ layer sequences 4 are written to by the orientation of the magnetic moments being set in controlled fashion. For this purpose, the memory cell is positioned between two electrical conductors, namely a bit line BL and a word line WL, as is illustrated in FIG. 7. By then sending suitable currents through the lines BL and WL, it is possible to generate a magnetic field at the location of the MTJ layer sequence 4, that is to say in the memory cell containing the latter, which magnetic field makes it possible to set the direction of the magnetic moments, that is to say, in particular, the direction of the magnetic moments in the soft-magnetic layer 2. In order to ensure the possibility of setting the magnetic moments in the soft-magnetic layer 2 of the MTJ layer sequence 4, it is generally sufficient if, in one of the lines BL and WL, the direction of the current flowing through the line can be reversed. Through corresponding changeover of the direction of the current, it is thus possible to switch between parallel and antiparallel orientation of the magnetizations and thus between a low-resistance and a high-resistance state of the memory cell.

Figure 8:
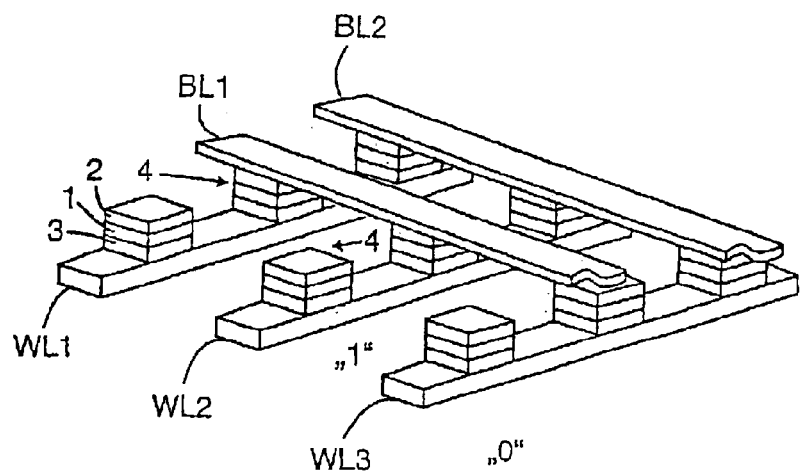
FIG. 8 is a perspective view of the memory matrix with MTJ layer sequences in accordance with FIGS. 5 to 7.

The already mentioned simplest conceivable construction of an MRAM configuration is illustrated in FIG. 8. The MTJ layer sequences 4 each form memory cells lying at the crossover points of word lines WL1, WL2, WL3 and bit lines BL1, BL2, which run parallel in each case. A specific memory cell is written to by sending corresponding currents through the bit line BL2 and the word line WL3, for example. A corresponding magnetic field then prevails at the crossover point between the bit line BL2 and the word line WL3 (that is to say on the far right in FIG. 8) on account of the currents, with the result that the MTJ layer sequence lying there or the memory cell formed by the latter is correspondingly written to.

What is advantageous about the configuration shown in FIG. 8 is its high-density configuration: in a completely ideal manner, only an area of, 4 $F^2$ is required per information content or bit, where F denotes the minimum feature size of the technology used. However, what may be regarded as a major disadvantage of such a configuration of an MRAM configuration is that considerable parasitic currents flow through adjacent cells during read-out on account of the only slight differences in the resistance value (about 15%; see above), with the result that such an MRAM configuration can only be read from very slowly overall.

Figure 9:
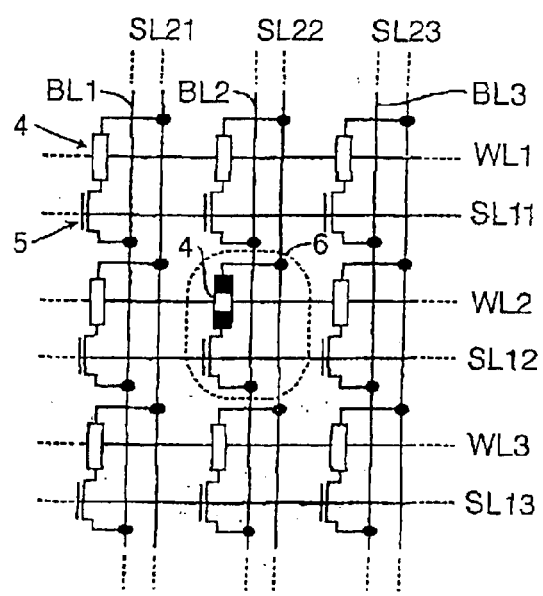
FIG. 9 is a circuit diagram of the memory matrix of a conventional MRAM configuration.

In order to avoid this disadvantage of the slow—and ultimately also unreliable on account of the parasitic currents—read-out of the MRAM configuration of FIG. 8, an MRAM outlined in FIG. 9 has already been proposed, in which each individual memory cell contains an MTJ layer sequence 4 and a selection transistor 5. A memory cell, surrounded by a broken line 6, is written to by sending corresponding currents through the word line WL2 and the bit line BL2. As a result, the MTJ layer sequence 4 of the memory cell is programmed correspondingly. For the read-out, select lines SL11 and SL13 are driven in such a way that the selection transistors 5 connected thereto are all turned off. By contrast, a voltage that is applied to a select line SL12 is such that the selection transistors 5 connected to the line turn on. A read signal is then applied to a select line SL22 of the select lines SL21 to SL23. The read signal flows via the MTJ layer sequence of the memory cell surrounded by the broken line 6, since only the selection transistor of this memory cell is in the on state, while all the other selection transistors of the remaining memory cells are turned off. A signal indicating the state of the MTJ layer sequence 4, that is to say an information content "0" or "1", can thus be obtained at the output of the select line SL22.

Parasitic effects of adjacent memory cells can practically be precluded with the MRAM configuration of FIG. 9. Consequently, the time for a read access is very short. What is disadvantageous about the MRAM of FIG. 9, however, is that the advantage of a high-density configuration is lost, since it is only possible to achieve an effective cell area of 8 $F^2$.

In order to resolve the above conflict between area requirement ("$F^2$") on the one hand, and fast read access without parasitic effects, on the other hand, thought has already been given, in the case of completely different memory configurations, namely DRAM configurations (DRAM=dynamic RAM), to use so-called "shared contacts", in which one contact of a selection transistor is used by a plurality of memory cells, preferably by two memory cells, and area ("$F^2$") is thus saved. However, this solution cannot be employed for MRAMs, and so the above problem area has also not been solved hitherto.

FIG. 1 shows a chain of the MRAM configuration according to an exemplary embodiment of the present invention with the selection transistors 5 and the MTJ layer sequences 4 which lie parallel to one another in each case. In other words, lying above the drain-source paths of the selection transistors 5 is in each case an MTJ layer sequence 4, which, for their part, are connected in series with one another in the chain, as also holds true for the drain-source paths of the selection transistors 5.

FIG. 2 shows an exemplary embodiment of the MRAM configuration according to the invention. Here a plurality of the chains shown in FIG. 1 with the MTJ layer sequences 4 and the selection transistors 5 lie parallel to one another, a separate selection transistor 7 also additionally being connected to-each chain. FIG. 2 also additionally shows first select lines SL1 and row select lines RSL, which are in each case formed by the separate selection transistors 7 and the drain-source paths of the selection transistors 5.

If a specific memory cell, for example a memory cell Z2 of the chain shown in FIG. 1, is to be read from, then first the separate selection transistor 7 of the chain is turned on, while all the remaining separate selection transistors of the memory matrix remain turned off or non-conducting. The selection transistor 5 of the memory cell Z2 is then turned off in this chain by the application of a corresponding signal to the select line SL1 assigned to the memory cell Z2, while all the remaining selection transistors 5 of the chain are changed over to the on state. A current path I1, as is indicated schematically in FIG. 1 by a solid line with an arrow, is thus present in the chain. Therefore, the resistance state of the MTJ layer sequence of the memory cell Z2 can readily be read out.

Figure 4:
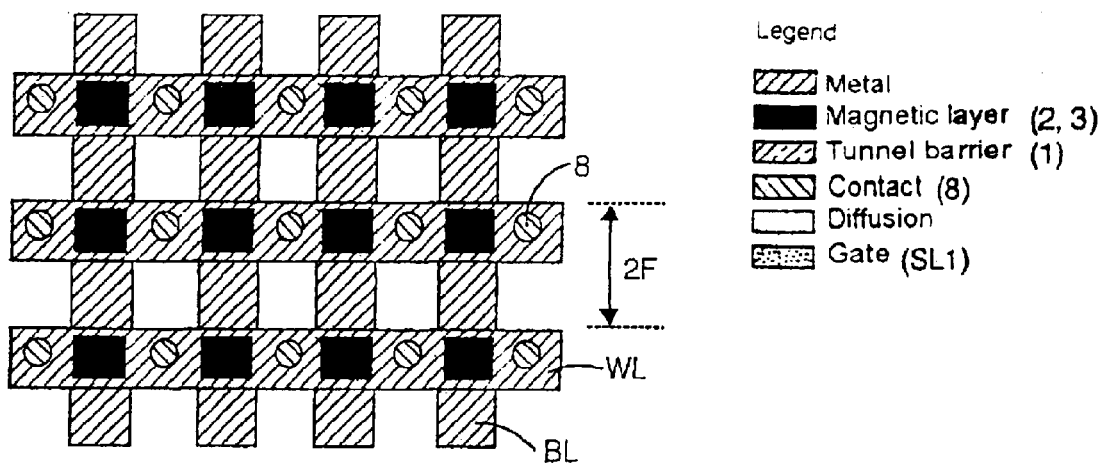
FIG. 4 is a plan view of the MRAM configuration of the exemplary embodiment of FIG. 3.

The process of reading into the MRAM configuration shown in FIGS. 1 and 2 is affected in a customary manner. In other words, the MTJ layer sequences 4 in each case lie between bit lines BL and word lines WL, as is illustrated in a concrete exemplary embodiment in FIGS. 3 and 4, of which FIG. 3 illustrates a sectional illustration and FIG. 4 illustrates a plan view. The legend shown beside these figures applies to both figures in this case.

As can be seen from both FIGS. 3 and 4, the MTJ layer sequences 4 lie between word lines WL and bit lines BL crossing the latter perpendicularly. By sending corresponding currents through the word lines WL and bit lines BL, MTJ layer sequences 4 located at the crossover points of such word lines and bit lines can be programmed as has been explained above.

The read-out is affected in the manner described above with reference to FIGS. 1 and 2. The separate selection transistor 7 of the chain with the memory cell to be read from is turned on, while all the other separate selection transistors 7 remain turned off. The selection transistor 5 of the memory cell to be read from in the chain is then turned off or made non-conducting by corresponding driving of the select line SL1, while all the remaining selection transistors of the chain are changed over to the on state by corresponding driving of their gates via the select lines SL1. In the memory cell with the turned-off transistor, that is to say in the memory cell to be read from, the read current then flows via the row select line RSL, that is to say via the drain-source paths of the selection transistors of the nonselected memory cells of the chain and via the MTJ layer sequence 4 of the selected memory cell with the turned-off selection transistor 5. In this way, the cell content of the selected memory cell can be read out rapidly and without parasitic currents.

FIGS. 3 and 4 also illustrate the minimum feature sizes F of the individual memory cells with 2 F in each case.

The invention thus enables a simply constructed MRAM configuration that departs completely from the previous concept of a series circuit of selection transistor and memory cell and instead provides a parallel circuit of selection transistor and MTJ layer sequence. This different construction makes it possible to ensure a high packing density, so that the above-specified object of the invention is achieved in an outstanding manner.

As can be seen from FIG. 3, in the MRAM configuration according to the invention, the bit lines BL run above the selection transistors 5 and specifically above the gate electrodes thereof at a distance therefrom.

We claim:

1. An MRAM configuration, comprising:

word lines;

bit lines running at a distance from said word lines;

first select lines;

second select lines; and a multiplicity of memory cells disposed in a memory matrix form, said memory cells containing MTJ layer sequences and selection transistors having gates and drain-source paths, said MTJ layer sequences in each case disposed between said word lines and said bit lines, said selection transistors connected to said select lines at said gates for reading from said memory cells, said MTJ layer sequences connected to said second select lines, in a respective one of said memory cells a respective MTJ layer sequence and a respective drain-source path of a respective one of said selection transistors in each case lie parallel to one another, so that said second select lines being formed by said drain-source paths of said selection transistors lying in series with one another.

2. The MRAM configuration according to claim 1, further comprising selection transistors, and each of said second select lines of a chain of said memory cells in said memory matrix lies in series with a separate one of said selection transistors.

3. The MRAM configuration according to claim 1, wherein said gates of said selection transistors are connected to said first select lines.

4. The MRAM configuration according to claim 1, wherein said memory cells have a minimum dimension being 4 $F^2$ where F denotes a minimum feature size of a technology used.

5. The MRAM configuration according to claim 1, wherein said first select lines are routed above said gates of said selection transistors.

6. The MRAM configuration according to claim 4, wherein said first select lines and said bit lines run parallel to one another.

* * * * *